(12) United States Patent
Morosawa et al.

(10) Patent No.: US 6,545,328 B1
(45) Date of Patent: Apr. 8, 2003

(54) SEMICONDUCTOR DEVICE

(75) Inventors: Narihiro Morosawa, Nara-ken (JP); Hiroshi Iwata, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/548,633

(22) Filed: Apr. 12, 2000

(30) Foreign Application Priority Data

Apr. 15, 1999 (JP) ............................................ 11-108644
Sep. 20, 1999 (JP) ............................................ 11-264962

(51) Int. Cl.$^7$ ............................................. H01L 27/82
(52) U.S. Cl. ............................ 257/413; 257/64; 257/66
(58) Field of Search ............................ 257/412–13, 377, 257/381–85, 249–50, 64, 66, 70, 75; 117/4–9, 201–204, 902, 930

(56) References Cited

U.S. PATENT DOCUMENTS

| 4,985,746 A | * | 1/1991 | Asahina | 257/371 |
| 5,392,237 A | * | 2/1995 | Iida | 365/185 |
| 5,803,965 A | * | 9/1998 | Yoon | 117/4 |
| 5,866,930 A | * | 2/1999 | Saida et al. | 257/316 |
| 6,005,284 A | * | 12/1999 | Ejiri et al. | 257/588 |
| 6,413,841 B1 | * | 7/2002 | Tsuboi | 438/486 |

FOREIGN PATENT DOCUMENTS

| EP | 0444712 A1 | * | 3/1991 |
| JP | 3-138930 A | | 6/1991 |
| JP | 6-224380 A | | 8/1994 |

* cited by examiner

Primary Examiner—Minh Loan Tran
Assistant Examiner—Thomas L Dickey
(74) Attorney, Agent, or Firm—Nixon & Vanderhye P.C.

(57) ABSTRACT

A semiconductor device includes an insulating gate field effect transistor including a gate electrode, wherein the gate electrode includes a polycrystalline semiconductor film having a crystal defect density of about $1\times10^{18}$ cm$^{-3}$ or less. In certain embodiments, the polycrystalline semiconductor film may be oxidation thermally annealed by subjecting the polycrystalline semiconductor film to thermal treatment in an oxidation atmosphere to carry out oxidization of the polycrystalline semiconductor film and activation of impurities simultaneously.

19 Claims, 13 Drawing Sheets

FIG. 17A  Without oxidization - conventional
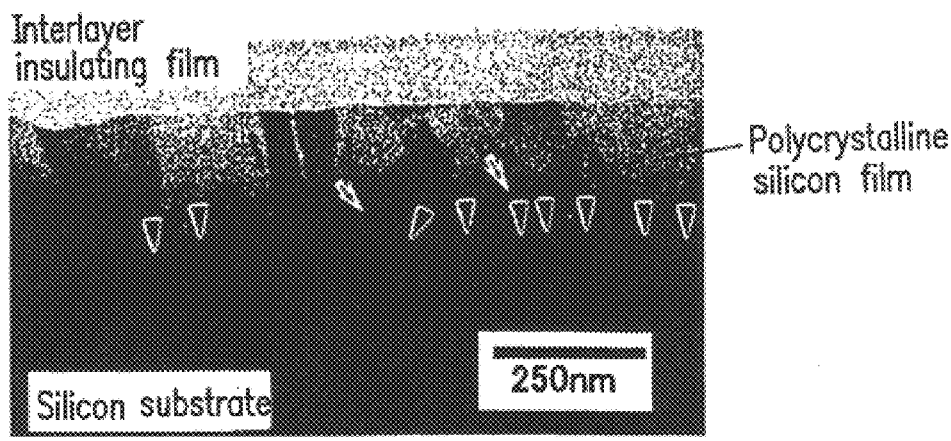
FIG. 17B  With oxidization
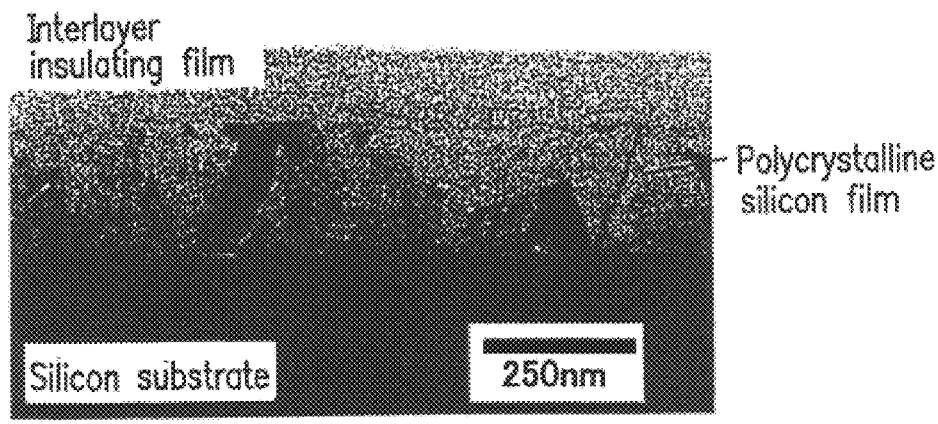

*FIG. 18A* Without oxidization
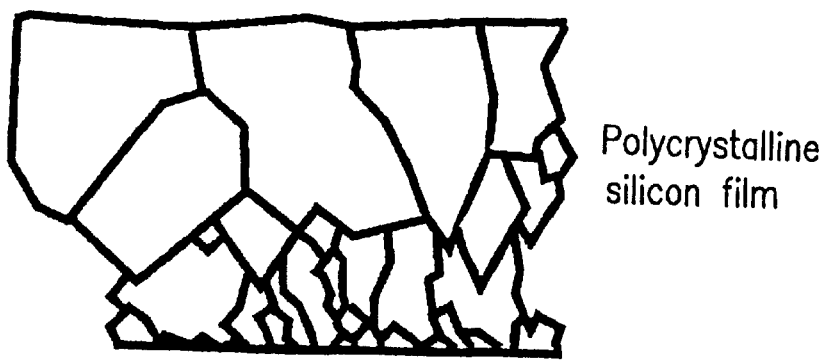
Polycrystalline silicon film
*FIG. 18B* With oxidization
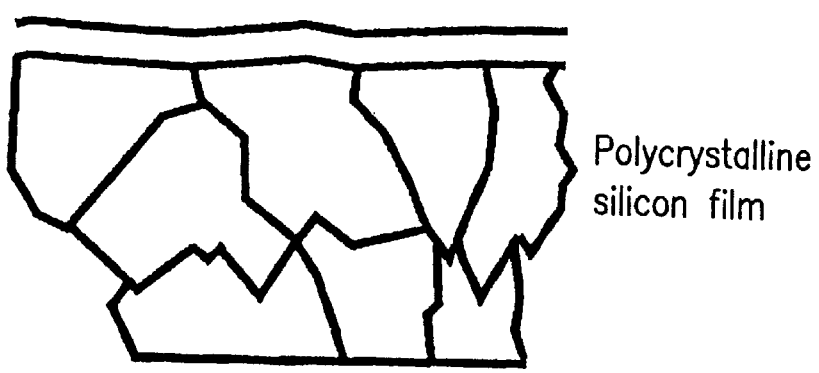
Polycrystalline silicon film Example Embodiments of Invention
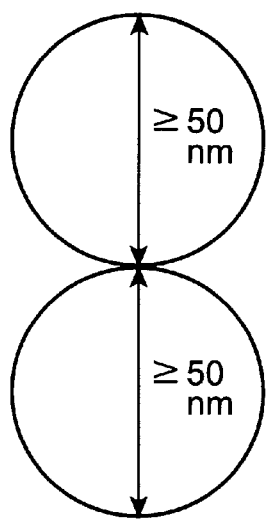
Prior Art
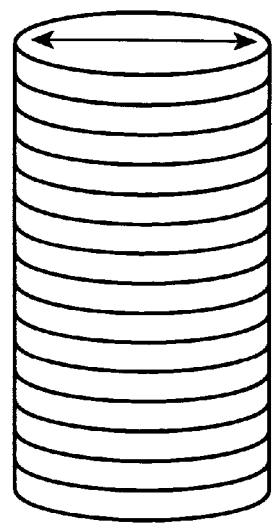
FIG. 19A
FIG. 19B

SEMICONDUCTOR DEVICE

BACKGROUND OF THE INVENTION

1. Field of the Invention

The present invention relates to a semiconductor device and a method for fabricating the same, and more particularly to a semiconductor device including a gate electrode or source/drain regions obtained by control of diffusion and activation of impurities in polycrystalline semiconductor film, and a method for fabricating the same.

2. Description of the Related Art

Recently, CMOS transistors having a dual-gate structure have been developed. The dual-gate structure is provided to prevent variation of the threshold voltage of a transistor as well as the short channel effect. This structure includes two surface-channel transistors, one of which is an NMOS transistor having a gate electrode containing an n-type impurity and the other of which is a PMOS transistor having a gate electrode containing a P-type impurity.

Japanese Laid-Open Publication No. 6-224380 discloses a method for doping a gate electrode of a conventional dual-gate structure CMOS transistor with an impurity and activating the impurity in the doped gate electrode. Specifically, as shown in FIG. 1, a p⁻-well 106, an n⁻-well 107, a field oxide film (element-isolating region) 102, and an inversion prevention layer 104 are provided on a semiconductor substrate 101 in a well-known way. A gate insulation film 105 (e.g., made of oxide film) is provided to cover those layers in a well-known way. A polycrystalline silicon film 103 to serve as a gate electrode is formed on the gate insulation film 105 with LPCVD. Thereafter, the polycrystalline silicon film 103 is patterned into the desired shape, and the source/drain regions and the gate electrode are doped with an impurity as a dopant by means of ion implantation. The resulting structure is then subjected to thermal treatment so as to activate the implanted dopant ions.

Japanese Laid-Open Publication No. 3-138930 discloses a transistor including a shallow junction which is provided in source/drain regions using a stacking structure for preventing the short channel effect which emerges as the transistor becomes smaller. FIG. 2 is a cross-sectional view showing diagrammatically a structure of the stacking-structure transistor disclosed the above-described publication.

In the conventional transistor having a structure as shown in FIG. 2, a gate electrode structure includes a gate insulating film 203, a gate electrode 204, and an insulating top layer 205. The gate electrode structure is provided over a region which will be a channel region between regions which will be source/drain regions 207. The gate electrode structure and those regions are positioned between field oxide films 202 (element-isolating regions) provided on a substrate 201. Sidewalls 211 are provided on the sides of the gate structure.

To form the source/drain regions 207 in this structure, a polycrystalline silicon film is provided to cover the gate electrode structure. Thereafter, the polycrystalline silicon film is etched back to a level indicated reference numeral 206 shown in FIG. 2. The polycrystalline silicon film 206 is doped with an impurity as a dopant and subjected to thermal treatment. The thermal treatment causes a solid phase diffusion so that the dopant diffuses from the polycrystalline silicon film 206 into the semiconductor substrate 201, thereby producing the source/drain regions 207.

After the formation of the source/drain regions 207, a silicide film 208 and an inactive dielectric layer 209 are formed over the polycrystalline silicon film 206, and a metal wire 210 is provided, resulting in the structure shown in FIG. 2.

However, when attempting to fabricate the conventional dual-gate-structure CMOS transistor using the surface-channel transistor, the following problems arise.

Phosphorous and arsenic as n-type impurities have a lower diffusion rate and a lower activation ratio in the polycrystalline silicon than Boron as a p-type impurity. For this reason, carriers are adversely depleted from the gate insulating film side of the gate electrode. The depletion layer of the gate electrode has a capacitance which is added in series to the capacitance of the gate insulating film, resulting in a reduction in effective capacitance. This reduces a driving current for the transistor. The driving current varies depending on the degree of depletion.

In general, impurity implantation is simultaneously carried out both for the gate electrode and the source/drain regions to be formed in order to reduce the number of steps in formation of the dual-gate-structure CMOS transistor. In this case, preferably, the source/drain function has a shallow junction so as to prevent the short channel effect of the transistor. To this end, reduced energy of ion implantation is preferable. This is, however, likely to deplete carriers from the gate electrode.

As described above, there is a trade-off between prevention of depletion in the gate electrode and prevention of the short channel effect. The prevention of the short channel effect leads to the depletion in the gate electrode. On the other hand, when the gate electrode is doped under conditions for preventing the depletion, the junction in the source/drain regions become deep, resulting in an increase in the short channel effect.

On the other hand, the short channel effect is increased as the size of the transistor is decreased. To prevent the short channel effect in this situation, the stacking-structure transistor has a shallow junction which is formed in the source/drain region using the stacking structure. When the source/drain regions are provided with the stacking structure using polycrystalline silicon film, the following problems arise.

To form as shallow a junction as possible, the amount of impurities implanted into the polycrystalline silicon film is preferably reduced so as to avoid the influence of extraordinary accelerated diffusion from a high-concentration region. The reduced amount of impurities of the source/drain regions does not cause the source/drain regions to have a sufficiently lowered level of resistance, resulting in an increase in parasitic resistance. This leads to a decrease in a transistor current in operation.

SUMMARY OF THE INVENTION

According to one aspect of the present invention, a method for fabricating a semiconductor device including a polycrystalline semiconductor film containing impurities, includes the steps of introducing the impurities into the polycrystalline semiconductor film; and subjecting the polycrystalline semiconductor film to thermal treatment in an oxidization atmosphere to carry out oxidization of the polycrystalline semiconductor film and activation of the impurities simultaneously.

According to another aspect of the present invention, a method for fabricating a semiconductor device including a polycrystalline semiconductor film containing impurities, includes the steps of depositing the polycrystalline semiconductor film; oxidizing the polycrystalline semiconductor film; introducing the impurities into the oxidized polycrystalline semiconductor film; and subjecting the oxidized polycrystalline semiconductor film to annealing to activating the impurities.

In one embodiment of this invention, the method for fabricating a semiconductor device includes the steps of: depositing an amorphous silicon film; and obtaining the polycrystalline silicon film by crystallizing the amorphous silicon film.

In one embodiment of this invention, the polycrystalline semiconductor film has a crystal defect density of about $1 \times 10^{18}$ cm$^{-3}$ or less.

In one embodiment of this invention, the polycrystalline semiconductor film is a polycrystalline silicon film.

In one embodiment of this invention, the impurities are phosphorous, boron, arsenic, or antimony.

According to another aspect of the present invention, a semiconductor device includes an insulating-gate field effect transistor structure having a gate electrode. The gate electrode includes a polycrystalline semiconductor film having a crystal defect density of about $1 \times 10^{18}$ cm$^{-3}$ or less.

In one embodiment of this invention, the gate electrode has a multilayer structure of the polycrystalline semiconductor film and a metal film or metal suicide film.

In one embodiment of this invention, the polycrystalline semiconductor film is a polycrystalline silicon film.

According to another aspect of the present invention, a semiconductor device includes an insulating-gate field effect transistor structure having source/drain regions stacked above a semiconductor substrate. The source/drain regions include a polycrystalline silicon film having a crystal defect density of about $1 \times 10^{18}$ cm$^{-3}$ or less.

In one embodiment of this invention, the source/drain regions have a multilayer structure of the polycrystalline semiconductor film and a metal film or metal silicide film.

In one embodiment of this invention, the polycrystalline semiconductor film is a polycrystalline silicon film.

According to another aspect of the present invention, a semiconductor device includes an insulating-gate field effect transistor structure having a gate electrode. The gate electrode includes a polycrystalline semiconductor film having an average crystal grain diameter of about 50 nm or more in the thickness direction.

According to another aspect of the present invention, a semiconductor device includes an insulating-gate field effect transistor structure having source/drain regions stacked above a semiconductor substrate. The source/drain regions have a polycrystalline semiconductor film having an average crystal grain diameter of about 50 nm or more in the thickness direction.

In one embodiment of this invention, the polycrystalline semiconductor film included in the gate electrode is a polycrystalline silicon film.

In one embodiment of this invention, the polycrystalline semiconductor film included in the source/drain regions is a polycrystalline silicon film.

According to this invention, in a semiconductor device including a polycrystalline semiconductor film containing impurities, the polycrystalline semiconductor film containing the impurities is formed by the step for introducing the impurities into the polycrystalline semiconductor film, and in the step for subjecting the polycrystalline semiconductor film to thermal treatment in an oxidization atmosphere to oxidize the polycrystalline semiconductor film, the impurities are activated. The oxidization atmosphere may be any atmosphere such as oxygen and water vapor which generates an oxidization reaction. The temperature of the oxidization is about 600° C. to about 1200° C. Since the polycrystalline semiconductor film is oxidized with the oxidization atmosphere during the activation of the impurities, the polycrystalline semiconductor film is recrystallized, thereby reducing the crystal defect density in the polycrystalline semiconductor film. For this reason, the amount of the impurities which are trapped by crystal defects and are not activated can be reduced, resulting in an increase in an activation ratio.

According to another aspect of this invention, impurities are introduced into an oxidized polycrystalline semiconductor film before the polycrystalline semiconductor film is subjected to annealing for activation of the impurities. This leads to recrystallization of the polycrystalline semiconductor film, thereby reducing the crystal defect density of the polycrystalline semiconductor film significantly. Only a reduced portion of impurities which are implanted into the polycrystalline semiconductor film in the later ion implantation is trapped by crystal defects. An increased activation ratio can be obtained after annealing for activation.

The polycrystalline semiconductor film may be, for example, polycrystalline silicon film. The crystal defect density of the polycrystalline silicon film is, for example, about $1 \times 10^{18}$ cm$^{-3}$ or less. The crystal defect density is smaller than the impurity amount by one order of magnitude or more, thereby sufficiently reducing the amount of impurities which are trapped by crystal defects and do not contribute to the activation.

The recrystallized polycrystalline semiconductor film is a polycrystalline film having an average crystal grain diameter of about 50 nm or more along the depth direction from the interface to the surface. The average crystal grain diameter is more preferably about 100 nm or more.

The polycrystalline semiconductor film may be, for example, polycrystalline silicon film. An average crystal grain diameter of the polycrystalline semiconductor film is about 50 nm or more, more preferably about 100 nm or more. The crystal defect density is therefore smaller than the impurity amount by one order of magnitude or more, thereby sufficiently reducing an amount of impurities which are trapped by crystal defects and do not contribute to the activation.

The above-described impurities may be phosphorous, boron, arsenic, or antimony. In particular, phosphorous has a high probability of being trapped by a defect in the polycrystalline silicon film. Therefore, reduction of crystal defects in the polycrystalline semiconductor film can increase the activation ratio significantly.

When the above-described polycrystalline semiconductor film is formed by the step for deposition of the amorphous silicon film and the step for crystallization of the amorphous silicon film, the resultant polycrystalline semiconductor film has a large crystal grain diameter. For this reason, the defect density in the film is decreased as compared with when direct deposition of the polycrystalline semiconductor film.

Further, when a gate electrode of an insulating-gate field effect transistor includes the above-described polycrystalline semiconductor film according to this invention, the following effects are obtained.

In general, to prevent depletion of a gate electrode, impurities having a concentration of about $1 \times 10^{19}$ cm$^{-3}$ or more are required. On the other hand, to control threshold voltage, a channel impurity concentration is preferably about $1 \times 10^{17}$ cm$^{-3}$ to about $3 \times 10^{17}$ cm$^{-3}$. In a typical ion implantation step, even when it is assumed that an impurity distribution is simply a Gaussian distribution, it is at a deep position about 4.3 σ from the peak depth Rp (projected range) of the impurity distribution that the impurity concentration is decreased by about three orders of magnitude. To avoid depletion, ion implantation is generally carried out so as to provide a peak concentration of about $1 \times 10^{20}$ cm$^{-3}$. To prevent impurity ions from penetrating into the channel, however, the depth position about 4.3 σ from the Rp should be within the polycrystalline silicon film included in the gate electrode. When this position is deeper than the thickness of the polycrystalline silicon film included in the gate electrode, the impurity ions reach the channel region. When the energy of ion implantation is set so that the depth position about 4.3 σ from the Rp is within the polycrystalline silicon, such ion implantation causes a very shallow Rp. This makes it difficult to keep an impurity concentration of about $1 \times 10^{19}$ cm$^{-3}$ or more in the gate electrode (the polycrystalline silicon film) in the vicinity of the gate insulating film.

On the other hand, in this invention, the above-described polycrystalline silicon film having a high activation ratio is used as the gate electrode. This makes it easy to keep an impurity concentration of about $1 \times 10^{19}$ cm$^{-3}$ or more in the gate electrode (the polycrystalline silicon film) in the vicinity of the gate insulating film while preventing the impurity ions from penetrating into the channel region.

Furthermore, the gate electrode of the insulating-gate field effect transistor can include a multilayer film of the polycrystalline silicon film obtained by this invention and a metal film or metal silicide film, thereby obtaining a gate electrode having a further low resistivity.

The source/drain regions, which are stacked above the channel region in the insulating-gate field effect transistor, can include the polycrystalline silicon film of this invention. In this case, the conventional high-concentration implantation is not required, since a relatively low impurity concentration can provide sufficient activation, resulting in a low resistivity. This prevents accelerated diffusion which is a problem in impurity implantation at high concentration, thereby making it easy to generate a shallow junction.

In general, in fabrication of the dual-gate-structure CMOS transistor, ion implantation into the gate electrode and ion implantation into the source/drain regions are simultaneously carried out so as to reduce the number of fabrication steps. Conventionally, to achieve the above-described simultaneous implantation in the stacking-structure source/drain regions, conditions for the implantation and diffusion (activation) should satisfy the following three conditions: a condition for preventing the gate depletion; a condition for preventing the impurities penetrating from the gate electrode into the channel region; and a condition for preventing the formation of a deep source/drain junctions by impurities expanding into the semiconductor substrate, thereby reducing the effective channel length. In this case, as described above, there is a trade-off relationship between prevention of the gate depletion and prevention of penetration of the impurities into the channel region. Similarly, there is a trade-off relationship between the condition for forming the non-offset source/drain regions and the condition for prevention of penetration of the impurities into the channel region. In the conventional technology, it is difficult to provide conditions satisfying the above-described three conditions simultaneously, resulting in a small process margin.

On the other hand, in this invention, it is possible to improve the activation ratio in the polycrystalline silicon film. Therefore, a small amount of implantation can provide a low resistivity and a low concentration of implantation. As a result, according to this invention, the process margin can be enlarged, so that the above-described three conditions can be easily satisfied.

The source/drain regions, which are stacked above the channel region in the insulating-gate field effect transistor, can include a multilayer film of the polycrystalline silicon film obtained by this invention and a metal film or metal silicide film, thereby obtaining a further low resistivity.

Hereinafter, the functions of this invention will be described.

According to this invention, a reduced crystal defect density (e.g., about $1 \times 10^{18}$ cm$^{-3}$ or less) of a polycrystalline semiconductor film (e.g., a polycrystalline silicon film) allows sufficient activation of the impurities therein. As a result, a semiconductor device (e.g., a transistor) having an excellent operating characteristic (e.g., sufficiently high transconductance).

Specifically, there is substantially no depletion of the gate electrode in a transistor including a gate electrode including the polycrystalline semiconductor film (e.g., the polycrystalline silicon film) of this invention. For this reason, there is substantially no variation in threshold voltage and there is a reduction in transistor current in operation. Furthermore, the step for obtaining the low resistivity of the gate and the formation of the source/drain regions can be simultaneously carried out, thereby simplifying the fabricating process.

In a transistor having the stacking structure, the source/drain regions, which are formed of the polycrystalline semiconductor film (e.g., the polycrystalline silicon film) of this invention, can have a low resistivity and a shallow junction simultaneously.

Thus, the invention described herein makes possible the advantages of (1) providing a semiconductor device obtaining a satisfactory characteristic by reducing a crystalline defect density in the polycrystalline semiconductor film constituting the gate electrode or the source/drain regions and therefore increasing an activation ratio of impurities; and (2) providing a method for fabricating the semiconductor device by annealing which allows a significant reduction in crystalline defect density of the polycrystalline semiconductor film.

These and other advantages of the present invention will become apparent to those skilled in the art upon reading and understanding the following detailed description with reference to the accompanying figures.

BRIEF DESCRIPTION OF THE DRAWINGS

FIG. 17A is a cross-sectional TEM photograph of a conventional polycrystalline silicon film.

FIG. 17B is a cross-sectional TEM photograph of a polycrystalline silicon film of this invention into which phosphorous is implanted as a dopant.

FIG. 18A is a diagram illustrating a polycrystalline crystal grain diameter based on the TEM photograph shown in FIG. 17B.

FIG. 18B is a diagram illustrating a polycrystalline crystal grain diameter based on the TEM photograph shown in FIG. 17A.

FIG. 19($a$) is a side plan view illustrating the crystal structure/orientation of certain example embodiments of the instant invention.

FIG. 19($b$) is a side plan view illustrating the crystal structure/orientation of certain prior art.

DESCRIPTION OF THE PREFERRED EMBODIMENTS

Example 1

Figure 1:
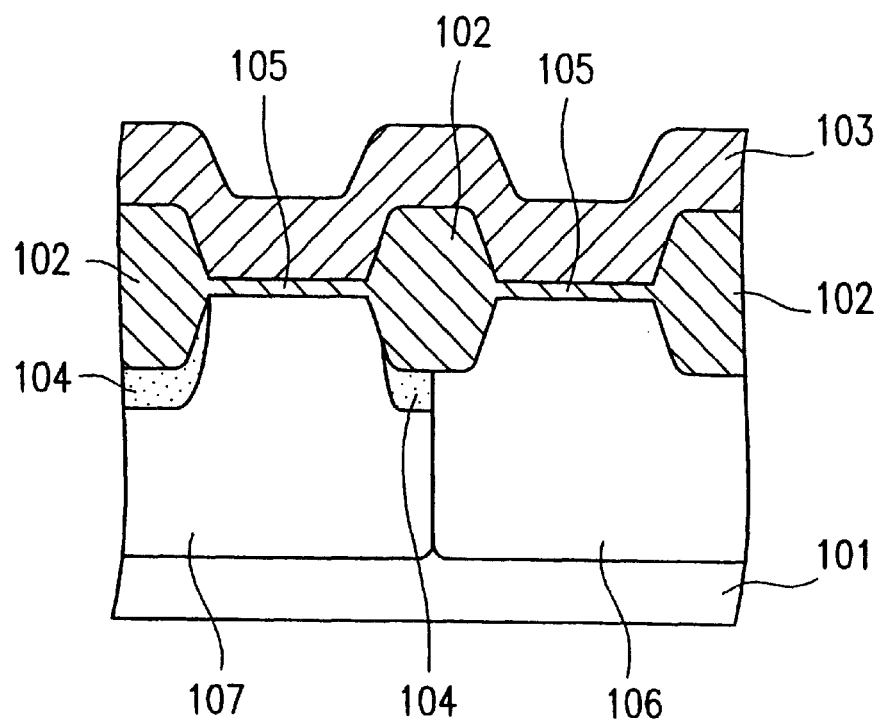
FIG. 1 is a cross-sectional view illustrating a fabricating process of a conventional dual-gate-structure CMOS transistor.
Figure 2:
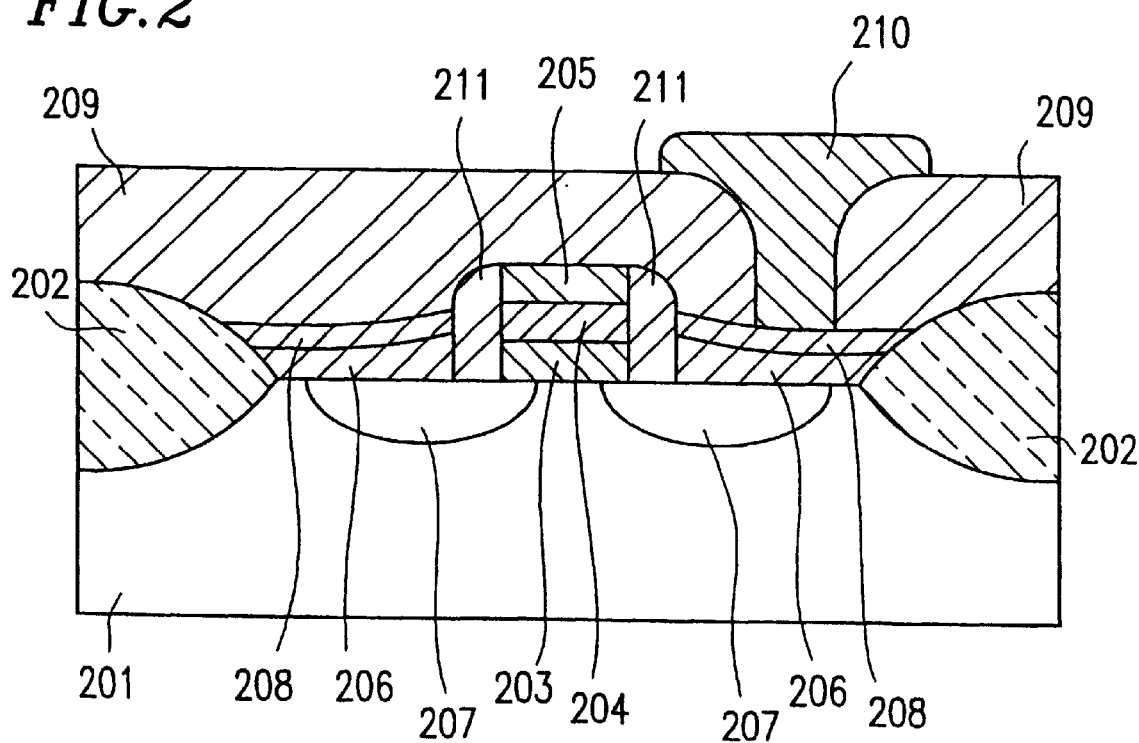
FIG. 2 is a cross-sectional view illustrating a configuration of a conventional stacking-structure transistor.
Figure 3:
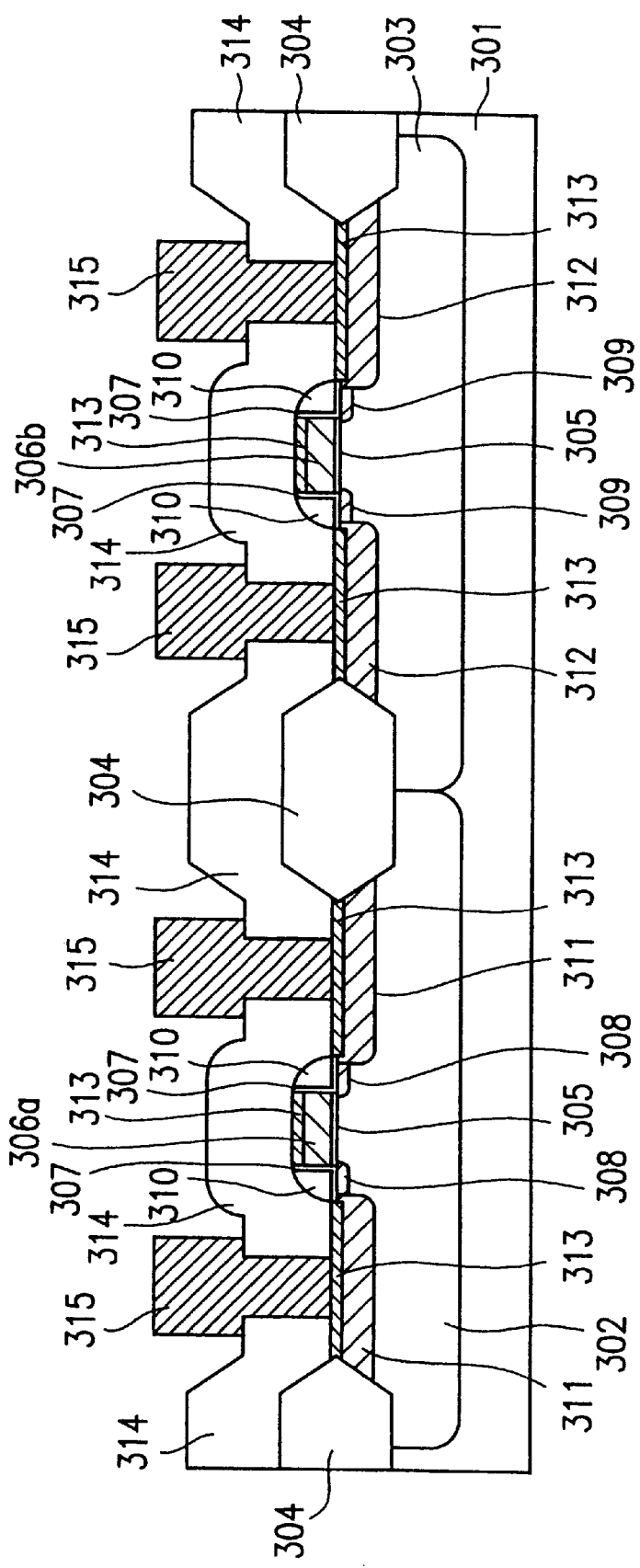
FIG. 3 is a cross-sectional view illustrating a fabricating process of a dual-gate-structure CMOS transistor semiconductor device according to Example 1 of the present invention.

FIG. 3 is a cross-sectional view illustrating a configuration of a dual-gate-structure CMOS transistor semiconductor device according to Example 1 of the present invention.

In FIG. 3, a p⁻-well 302, an n⁻-well 303, and a field oxide film (element-isolating region) 304 are provided on a semiconductor substrate 301 such as a silicon substrate.

The p⁻-well 302 provides a region where an NMOS transistor element is formed. The NMOS transistor includes a gate insulating film 305 (such as an oxide film), an n⁺-polycrystalline gate electrode 306a, a silicon nitride film 307 formed on both sides of the n⁺-polycrystalline gate electrode 306a, a shallow n-type diffusion layer 308 (LDD region), a sidewall spacer 310, a deep n⁺-diffusion layer 311, a silicide film 313, an interlayer insulating film 314, and a metal wire 315. The n⁻-well 303 provides a region where a PMOS transistor element is formed. The PMOS transistor includes a gate insulating film 305 (such as an oxide film), a p⁺-polycrystalline gate electrode 306b, a silicon nitride film 307, a shallow p-type diffusion layer 309 (LDD region), a sidewall spacer 310, a deep p⁺-diffusion layer 312, a silicide film 313, an interlayer insulating film 314, and a metal wire 315.

In the dual-gate-structure CMOS transistor semiconductor device thus constructed as described above, the polycrystalline silicon films included in the gate electrodes 306a and 306b have an average crystal grain diameter of about 50 nm or more, more preferably about 100 nm or more. This size prevents the crystal defect density of the polycrystalline silicon film from exceeding about $1 \times 10^{18}$ cm⁻³. With the polycrystalline silicon film having a crystal defect density of about $1 \times 10^{18}$ cm⁻³, the amount of impurities which are trapped by the crystal defect and not activated can be reduced in the gate electrodes 306a and 306b, thereby increasing the activation ratio of impurities. For this reason, the concentration of activated impurities in the vicinity of the gate insulating film 305 in the gate electrodes 306a and 306b can be easily set to about $1 \times 10^{19}$ cm⁻³ or more. This prevents occurrence of the depletion layer in the gate electrodes 306a and 306b. Further, the low crystal defect density prevents diffusion of impurities. The impurities implanted in the gate electrodes 306a and 306b (polycrystalline silicon film) do not penetrate through the gate insulating film 305, so that the characteristics of a transistor are not degraded.

Figure 4:
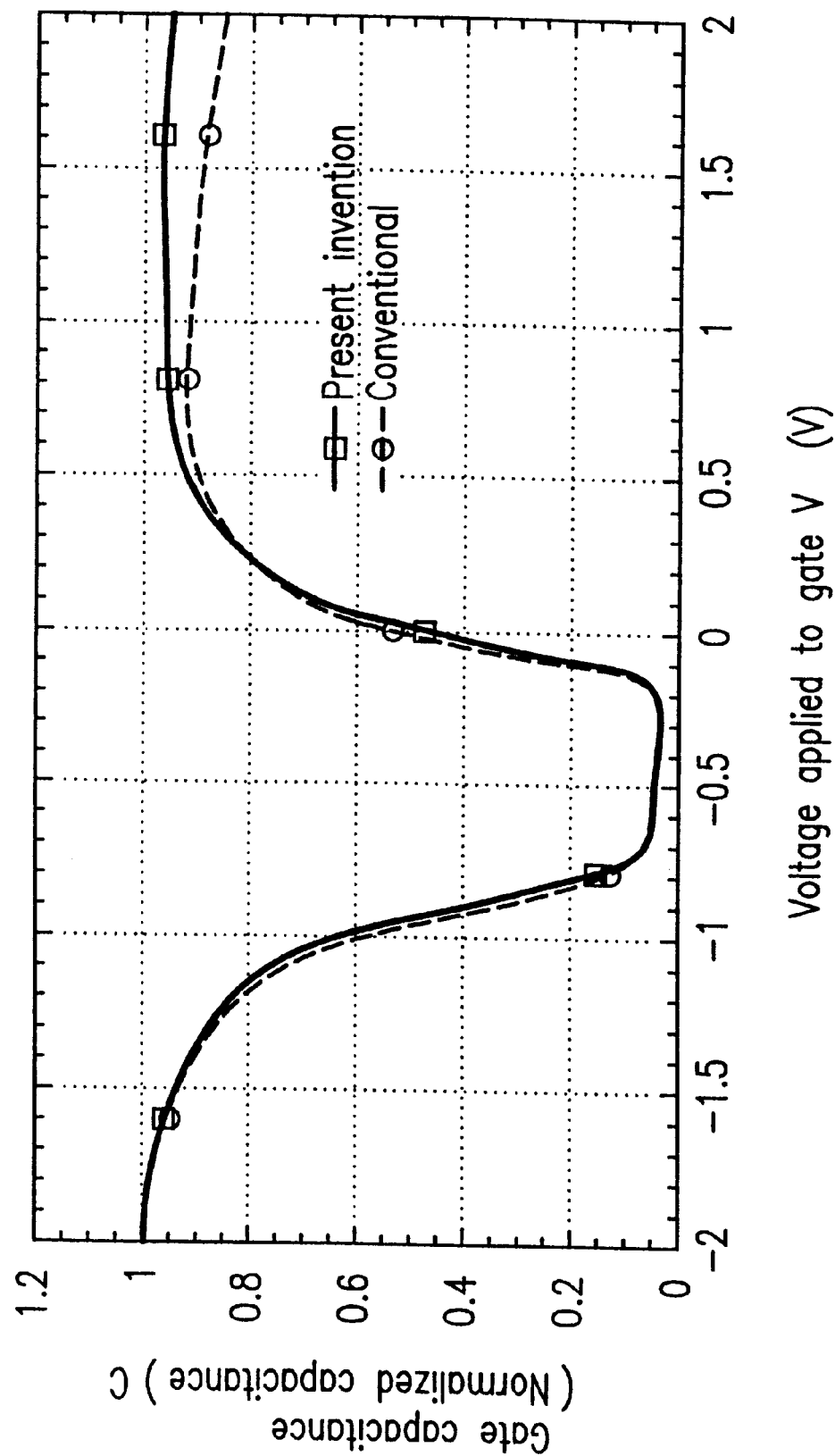
FIG. 4 is a diagram showing the C–V characteristics of an NMOS transistor included in the dual-gate-structure CMOS transistor semiconductor device shown in FIG. 3, and the C–V characteristics of a conventional device.

FIG. 4 shows low frequency C–V characteristics of the dual-gate-structure CMOS transistor semiconductor device of Example 1 in which the NMOS transistor includes the gate electrode 306a made of the polycrystalline silicon film according to this invention and the gate electrode 306a is fabricated with phosphorous implantation. The low frequency C–V characteristics are indicated by a continuous line. For comparison, FIG. 4 also shows, by a dashed line, the characteristics of the conventional semiconductor device obtained by annealing in nitrogen atmosphere.

As shown in FIG. 4, in the conventional device indicated by the dashed line, as a voltage V applied to the gate is increased, the gate capacitance (normalized capacitance) C is decreased, resulting in the depletion in the gate electrode. In Example 1, such depletion is reduced, thereby obtaining satisfactory C–V characteristics.

Figure 5:
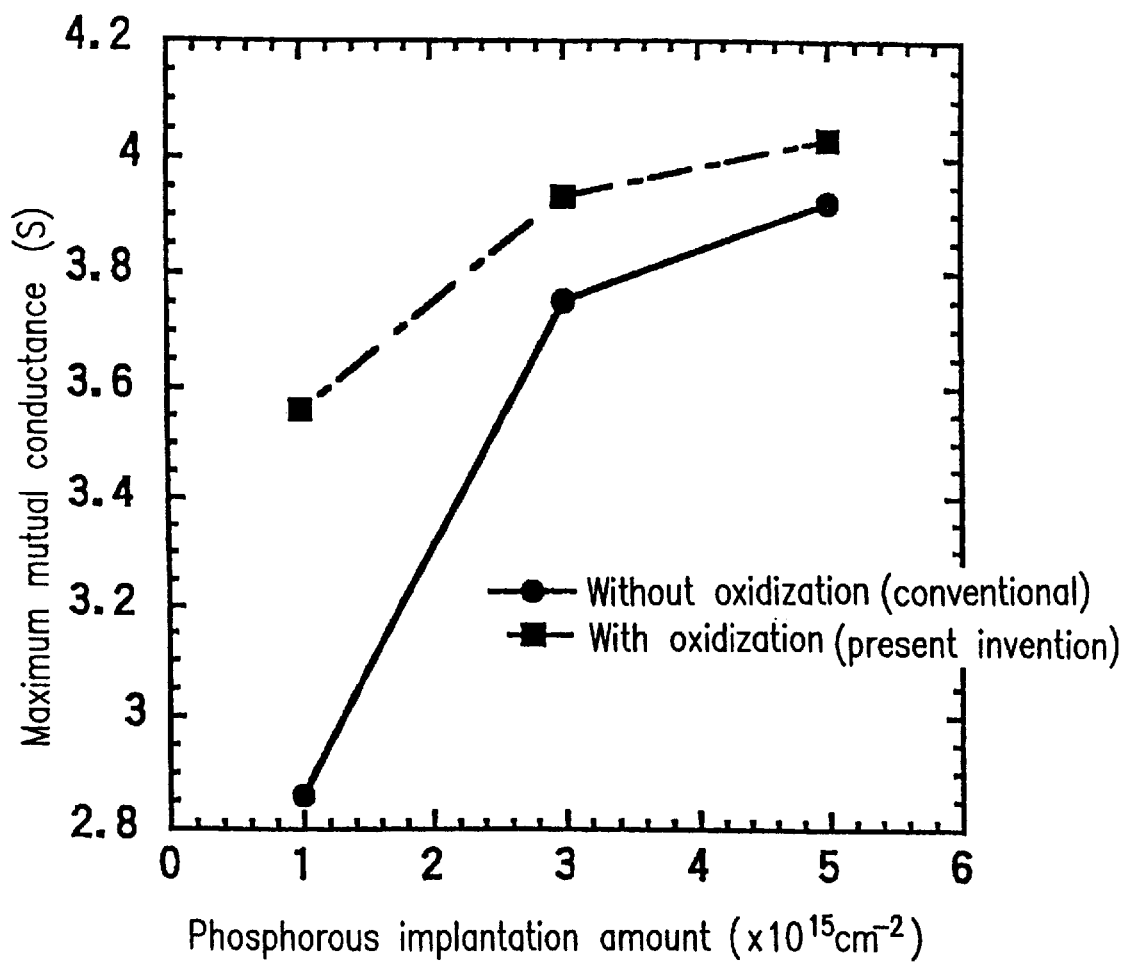
FIG. 5 is a diagram showing the dependence of maximum mutual conductance on the amount of implanted phosphorous with respect to the NMOS transistor included in the dual-gate-structure CMOS transistor semiconductor device shown in FIG. 3, and the dependence of maximum mutual conductance on the amount of implanted phosphorous obtained in a conventional device.

FIG. 5 shows, by a continuous line, the dependence of maximum mutual conductance on the amount of implanted phosphorous with respect to the NMOS transistor included in the dual-gate-structure CMOS transistor semiconductor device. For comparison, FIG. 5 also shows, by a dashed line, the characteristics of the conventional semiconductor device obtained by annealing in nitrogen atmosphere.

When oxidization annealing is carried out, the maximum mutual conductance is increased at any amount of implanted impurities. The oxidization annealing can improve the characteristics of the transistor.

Moreover, when phosphorous is used as a dopant, a greater improvement of the characteristics obtained by the oxidization annealing according to this invention is obtained as compared with when other impurity ions are used. The effect of the oxidization annealing according to this invention is the most significant when phosphorous is implanted.

FIG. 17B shows a cross-sectional TEM photograph of the polycrystalline silicon film which is doped with phosphorous as a dopant and which is used in the gate electrode 306a of the NMOS transistor in the dual-gate-structure CMOS transistor semiconductor device of Example 1. For comparison, FIG. 17A also shows a cross-sectional TEM photograph of polycrystalline silicon film used in the conventional semiconductor device obtained annealing in nitrogen atmosphere.

As indicated by arrows in FIG. 17A, when the oxidization annealing is not carried out, there are a number of polycrystalline silicon grains having a small diameter in the vicinity of the interface with the gate insulating film. On the other hand, as shown in FIG. 17B, the oxidization annealing leads to an increase in the grain diameter of the polycrystalline silicon in the vicinity of the interface with the gate insulating film.

FIGS. 18A and 18B are diagrams illustrating the cross-sectional TEM photographs shown in FIGS. 17A and 17B, respectively, in such a way to make it easy to see the diameter of the polycrystalline grains. Here the oxidization annealing oxidizes a polycrystalline silicon film having a thickness of about 250 nm by about 50 nm. As can be seen from FIGS. 18A and 18B, the crystal grain diameter of the polycrystalline silicon film subjected to the oxidization annealing is larger than when the oxidization is not carried out. In particular, the polycrystalline silicon grains smaller than about 50 nm above the interface grow to a large diameter which is almost the same as that of the grains near the interface. As a result, the oxidization annealing allows the polycrystalline silicon film having the crystal grains having uniform diameters along the cross section or the depth direction.

The crystal grain diameter grows to a large size in the entire polycrystalline silicon film. The average grain diameter is greater than or equal to about 50 nm. Here the average grain diameter is obtained by taking the diameter of grains along the depth direction of the polycrystalline silicon film having a thickness of greater than or equal to about 200 nm. The thickness spans from the interface with the gate insulating film to the upper surface of the polycrystalline silicon film. When the oxidization annealing is not carried out in the polycrystalline silicon film, there are a number of polycrystalline silicon grains having a small diameter, smaller than about 50 nm, above the interface. On the other hand, when the oxidization annealing is carried out, the polycrystalline silicon film has an average grain diameter greater than or equal to about 50 nm. The grain diameter of the polycrystalline silicon film is preferably greater than or equal to about 100 nm. As a result, the crystal defects in the vicinity of the interface are reduced to a crystal defect density of about $1 \times 10^{18}$ cm$^{-3}$ or less, thereby increasing the activation ratio of impurities in the polycrystal.

In the dual-gate-structure CMOS transistor semiconductor device of Example 1, the polycrystalline silicon film which is included in the gate electrodes 306a and 306b has a low crystal defect density (specifically, about $1 \times 10^{18}$ cm$^{-3}$ or less). For this reason, carriers are not depleted in the gate electrodes 306a and 306b and impurity implantation can be carried out with a low level of energy, thereby preventing the short channel effect. Further, the low crystal defect density prevents diffusion of impurities, whereby implanted impurity ions do not penetrate through the gate insulating film 305, so that the characteristics of the transistor are not degraded. Moreover, the semiconductor device of Example 2 does not need a particular processing device which grows a phosphorous-implanted polycrystalline silicon film, as in the conventional technology disclosed in Japanese Laid-Open Publication No. 6-275788. This can improve the throughput of fabricating the device and reduce the fabricating cost.

Next, a method for fabricating the dual-gate-structure CMOS transistor semiconductor device of Example 1 will be described with reference to FIGS. 6 through 11. FIGS. 6 through 11 are cross-sectional views illustrating structures obtained in steps in the fabricating method.

Figure 6:
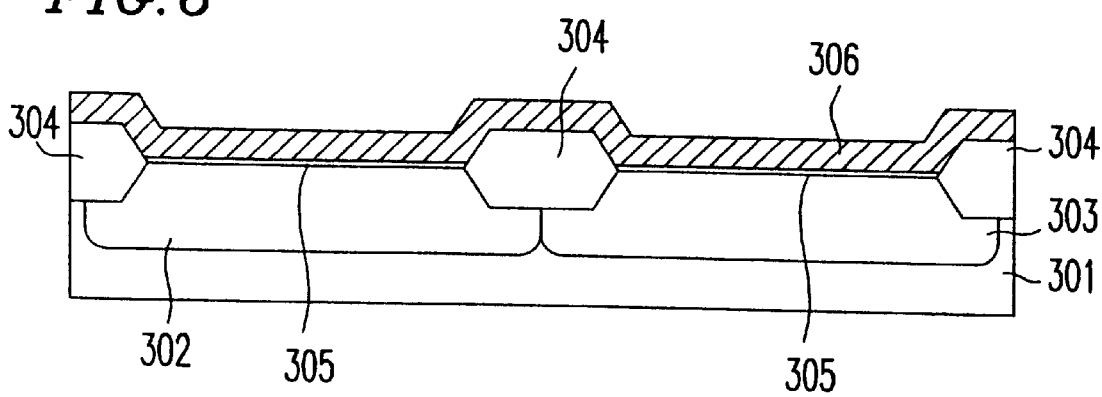
FIG. 6 is a cross-sectional view illustrating a fabricating step of the dual-gate-structure CMOS transistor semiconductor device shown in FIG. 3.

As shown in FIG. 6, a p$^-$-well 302, an n$^-$-well 303, and a field oxide film (element-isolating region) 304 are formed on a silicon substrate 301 in a known way in the art.

To control the threshold voltage and prevent the short channel effect, a region in which an NMOS transistor element is to be formed (the p$^-$-well 302) is doped with boron and a region in which a PMOS transistor element is to be formed (the n$^-$-well 303) is doped with phosphorous. Those elements are implanted as impurity ions. A gate insulating film 305 (e.g., an oxide film) having a thickness of about 5 nm is then formed on the wells 302 and 303. An amorphous silicon film 306 is then deposited to cover the field oxide film 304 and the gate insulating film 305 with LPCVD at a temperature of about 550° C. The thickness of the amorphous silicon film 306 is between about 100 nm and about 300 nm, more preferably about 150 nm.

Subsequently, the amorphous silicon film 306 is crystal-grown (crystallized) in an atmosphere of nitrogen gas at a temperature of about 650° C., resulting in a polycrystalline silicon film. This polycrystalline silicon film is referred to with the same reference number 306 as used for the amorphous silicon film. The polycrystalline silicon film 306 may be directly formed by LPCVD. The crystal growth of the amorphous silicon film can obtain a polycrystalline silicon film having a greater grain diameter.

The polycrystalline silicon film 306 is then subjected to oxidization annealing so as to reduce the crystal defect density thereof (specifically, to about $1 \times 10^{18}$ cm$^{-3}$ or less). In Example 1, a gate electrode will be formed using the polycrystalline silicon film 306. Instead of the polycrystalline silicon film, another material such as polycrystalline silicon germanium film can be provided. Alternatively, a multilayer structure including the above described polycrystalline semiconductor film and a metal film such as tungsten or a metal silicide film may be used as the polycrystalline silicon film 306.

FIG. 6 shows a cross-sectional view of the structure which has been so far fabricated.

The polycrystalline silicon film 306 is then patterned to the desired shape with well-known photolithography and etching techniques, thereby obtaining the gate electrodes 306a and 306b. A natural oxidization film existing on surfaces of the gate electrodes 306a and 306b made of the polycrystalline silicon film and the oxide film 305 existing on the wells 302 and 303 (activated region=the source/drain region) which are not covered with the gate electrodes 306a and 306b are completely removed with a solution of hydrofluoric acid or the like. Silicon nitride film is deposited to cover the gate electrodes 306a and 306b, the wells 302 and 303, and the field oxide film (element-isolating film) 304. This silicon nitride film serves as an impurity implantation protecting film 307, the thickness of which is about 3 nm to about 30 nm, more preferably about 5 nm. For the implantation protecting film 307, silicon oxide film may be used instead of the silicon nitride film. In this case, for the knock-on effect, oxygen atoms are knocked on by the implanted ions so as to move from the silicon oxide film to the wells. These oxygen atoms prevent salicidation in a subsequent step. For this reason, the silicon nitride film is used as the implantation protecting film 307.

Alternatively, impurity ions may be implanted without the implantation protecting film 307.

Figure 7:
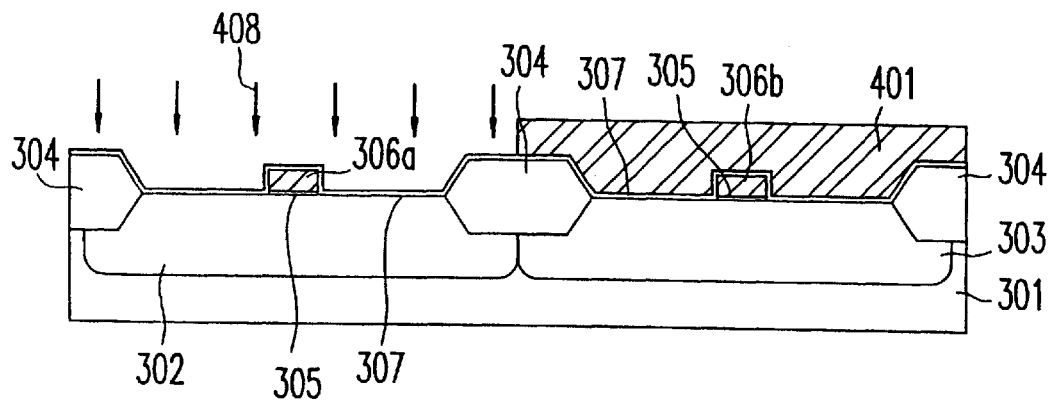
FIG. 7 is a cross-sectional view illustrating another fabricating step of the dual-gate-structure CMOS transistor semiconductor device shown in FIG. 3.
Figure 8:
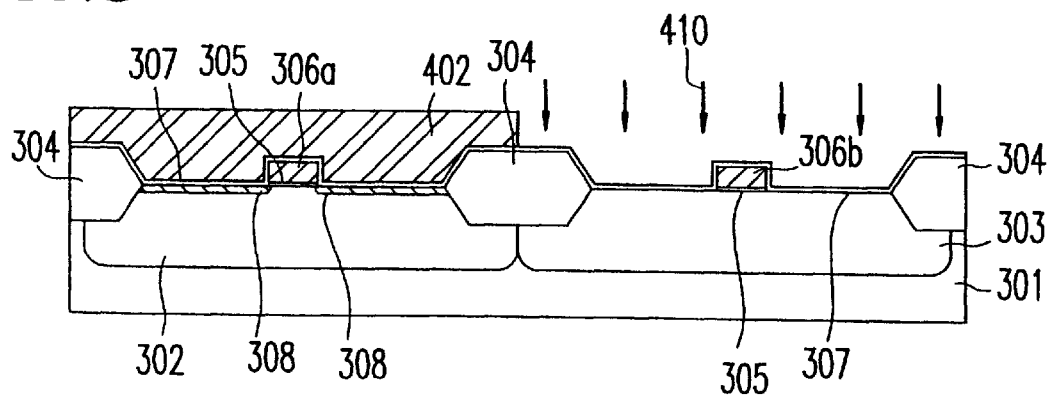
FIG. 8 is a cross-sectional view illustrating another fabricating step of the dual-gate-structure CMOS transistor semiconductor device shown in FIG. 3.

A shallow junction is then provided in the vicinity of a channel of the region in which an NMOS transistor element is to be formed (the p⁻-well 302). To this end, as shown in FIG. 7, the region in which a PMOS transistor element is to be formed (the n⁻-well 303) is covered with a photoresist film 401 by a photolithography step. Arsenic ions 408 are then implanted into the region in which an NMOS transistor element is to be formed (the p⁻-well 302). This ion implantation is carried out with an accelerating energy of about 2 keV to about 30 keV and an implantation of about $0.5 \times 10^{14}$ $cm^{-2}$ to about $5 \times 10^{14}$ $cm^{-2}$. The arsenic ions are impurity ions which serve as donors in the silicon semiconductor. Thus, an impurity diffusion region 308 is formed in the p⁻-well 302 as shown in FIG. 8, which will be a shallow n-type diffusion layer 308.

Alternatively, antimony ions may be used as the above-described impurity ions for the NMOS transistor element. Antimony-ion implantation is carried out with an accelerating energy of about 3 keV to about 35 keV to obtain an implantation amount of about $0.5 \times 10^{14}$ $cm^{-2}$ to about $5 \times 10^{14}$ $cm^{-2}$.

Figure 9:
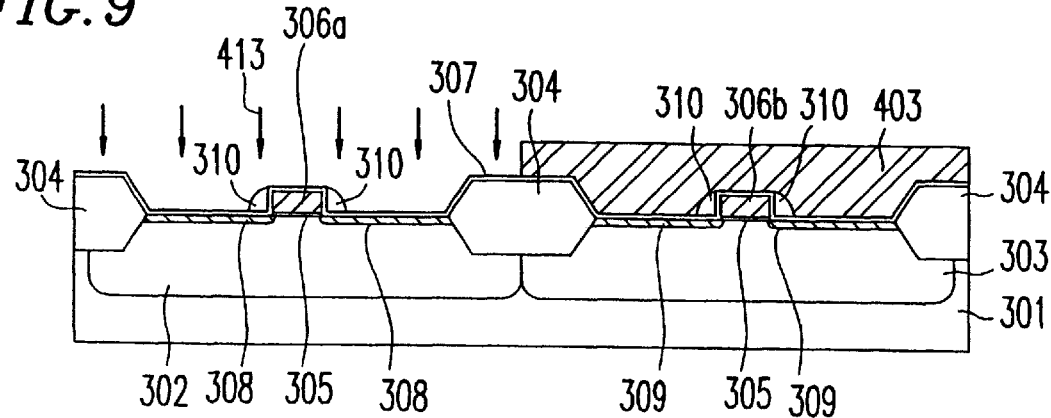
FIG. 9 is a cross-sectional view illustrating another fabricating step of the dual-gate-structure CMOS transistor semiconductor device shown in FIG. 3.

Next, after removing the photoresist film 401, another shallow junction is then provided in the vicinity of a channel of the region in which a PMOS transistor element is to be formed (the n⁻-well 303). To this end, as shown in FIG. 8, the region in which an NMOS transistor element is to be formed (the p⁻-well 302) is covered with a photoresist film 402 by a photolithography step. Boron ions 410 are then implanted into the region in which a PMOS transistor element is to be formed (the n⁻-well 303). This ion implantation is carried out with an accelerating energy of about 5 keV to about 40 keV to obtain an implantation amount of about $0.5 \times 10^{14}$ $cm^{-2}$ to about $5 \times 10^{14}$ $cm^{-2}$. The Boron ions are impurity ions which serve as acceptors in the silicon semiconductor. Thus, an impurity diffusion region 309 is formed in the n⁻-well 303 as shown in FIG. 9, which will be a shallow p-type diffusion layer 309.

Alternatively, In ions may be used as the above-described impurity ions for the PMOS transistor element.

After removing the photoresist film 402, a sidewall spacer 310 is formed on the sides of the gate electrodes 306a and 306b. Specifically, silicon nitride film is deposited to have a thickness of about 100 nm to about 200 nm. This silicon nitride film is etched back until the upper surface of the silicon oxide film on the element-isolating film 304 is exposed, thereby obtaining the sidewall spacer 310. This etching is carried out by reactive ion etching (RIE) using a mixture of $C_4F_8$ and CO gas as etchant. The gas mixture has a selection ratio of silicon nitride film to silicon oxide film which is about 50 to about 100 to 1. The sidewall spacer 310 is preferably made of the silicon nitride film in order that bird's beak can be reduced in a subsequent oxidization step. The sidewall spacer 310 may have a two-layer structure including a silicon oxide film and a silicon nitride film.

Thereafter, source/drain diffusion layers having a deep junction (deep diffusion layers 311 and 312) are provided.

Specifically, as shown in FIG. 9, the region in which a PMOS transistor element is to be formed on the n⁻-well 303 is covered with a photoresist film 403 by a photolithography step. Arsenic ions 413 are then implanted into the region in which an NMOS transistor element is to be formed on the p⁻-well 302. This ion implantation is carried out with an accelerating energy of about 15 keV to about 50 keV to obtain an implantation amount of about $1 \times 10^{15}$ $cm^{-2}$ to about $5 \times 10^{15}$ $cm^{-2}$, more specifically an accelerating energy of about 30 keV to obtain an implantation amount of about $3 \times 10^{15}$ $cm^{-2}$. The arsenic ions are impurity ions which serve as donors in the silicon semiconductor.

Next, after removing the photoresist film 403, the shallow n⁻-diffusion layer 308 and the deep n-type diffusion layer 311 are formed in the region in which an NMOS transistor element is to be formed on the p⁻-well 302. This is achieved by activating the implanted impurities by annealing in an atmosphere of nitrogen gas at a temperature of about 850° C. to about 900° C. Meanwhile, in the region in which a PMOS transistor element is to be formed on the n⁻-well 303, the boron atoms which have been previously implanted are activated, so that the shallow p-type diffusion layer 309 is formed.

Figure 10:
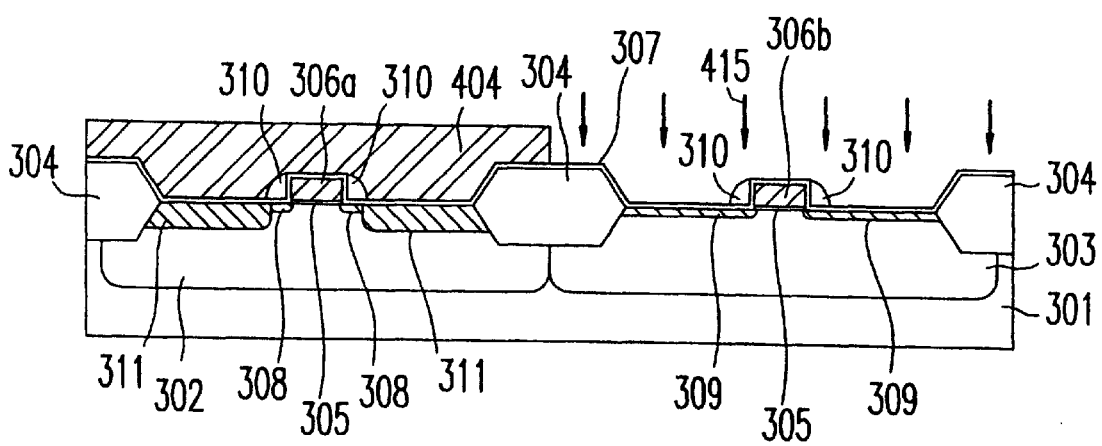
FIG. 10 is a cross-sectional view illustrating another fabricating step of the dual-gate-structure CMOS transistor semiconductor device shown in FIG. 3.

Thereafter, a deep junction is provided in the vicinity of a channel of the region in which a PMOS transistor element is to be formed on the n⁻-well 303. To this end, as shown in FIG. 10, the region in which an NMOS transistor element is to be formed on the p⁻-well 302 is covered with a photoresist film 404 by a photolithography step. Silicon ions are then implanted into the region in which a PMOS transistor element is to be formed on the n⁻-well 303. This ion implantation is carried out with an accelerating energy of about 30 keV to obtain an implantation amount of about $1 \times 10^{15}$ $cm^{-2}$. The silicon ions play a role in preventing a channeling effect. The arsenic ions are impurity ions which serve as donors in the silicon semiconductor. Boron ions 415 are then implanted into the region in which a PMOS transistor element is to be formed on the n⁻-well 303. This ion implantation is carried out with an accelerating energy of about 10 keV to about 30 keV to obtain an implantation amount of about $1 \times 10^{15}$ $cm^{-2}$ to about $5 \times 10^{15}$ $cm^{-2}$. The boron ions are impurity ions which serve as acceptors in the silicon semiconductor.

Next, after removing the photoresist film 404, the deep p-type diffusion layer 312 is formed in the region in which a PMOS transistor element is to be formed on the n⁻-well 303. This is achieved by activating the implanted impurities by rapid thermal annealing (RTA) at a temperature of about 1000° C. for about 10 seconds.

Figure 11:
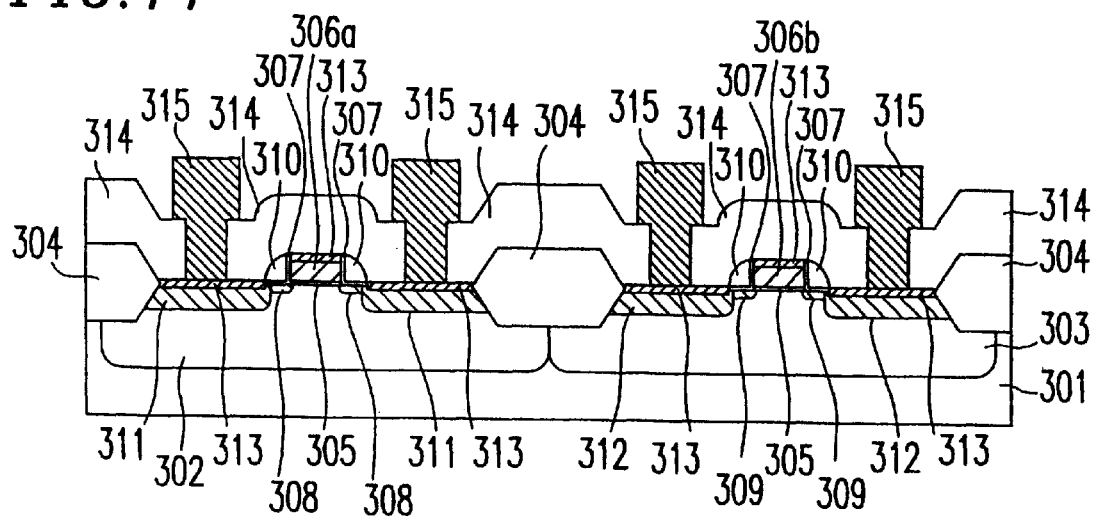
FIG. 11 is a cross-sectional view illustrating another fabricating step of the dual-gate-structure CMOS transistor semiconductor device shown in FIG. 3.

Thereafter, formation of a silicide film 313 by a salicidation step, deposition of an interlayer insulating film 314, formation of a metal wire 315 and the like are carried out in a well-known way. As a result, a dual-gate-structure CMOS transistor semiconductor device having the desired structure as shown in FIG. 11 is obtained.

In the description of Example 1, the polycrystalline silicon film 306 which is to be the gate electrodes 306a and 306b is oxidized before the patterning. The oxidization annealing may be carried out after the patterning. That is, after the gate electrodes 306a and 306b are patterned, ion implantation is carried out followed by annealing for activating the ions. In this case, activation of impurities and reduction of crystal defects are simultaneously carried out, resulting in an increase in the activation ratio.

Alternatively, ion implantation to the polycrystalline silicon film 306 may be carried out before patterning, followed by oxidization annealing. Thereafter, the polycrystalline silicon film 306 may be patterned to obtain the gate electrodes 306a and 306b, and then a step for forming the source/drain regions may be carried out.

Example 2

Figure 12:
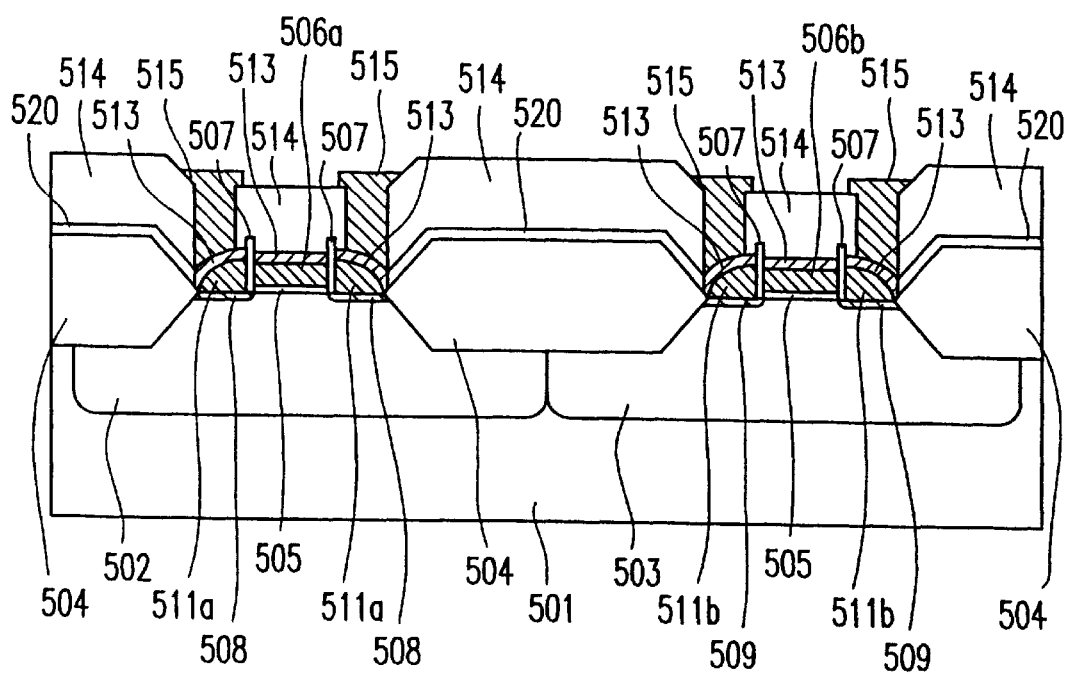
FIG. 12 is a cross-sectional view illustrating a configuration of a stacking-structure CMOS transistor semiconductor device according to Example 2 of the present invention.

FIG. 12 is a cross-sectional view illustrating a configuration of a dual-gate-structure CMOS transistor semiconductor device according to Example 2 of the present invention.

In FIG. 12, a p⁻-well 502, an n⁻-well 503, and a field oxide film (element-isolating region) 504 are provided on a semiconductor substrate 501 such as a silicon substrate. The p⁻-well 502 provides a region where an NMOS transistor element is formed. The NMOS transistor includes a gate insulating film 505 (such as an oxide film), an n⁺ polycrystalline gate electrode 506a, a pair of sidewalls 507, a shallow n-type diffusion layer 508, an n⁺ polycrystalline source/drain regions 511a, a silicide film 513, an interlayer insulating film 514, and a metal wire 515. The n⁻-well 503 provides a region where a PMOS transistor element is formed. The PMOS transistor includes a gate insulating film 505 (such as an oxide film), a p⁺ polycrystalline gate electrode 506b, a pair of sidewalls 507, a shallow p-type diffusion layer 509, a p⁺-polycrystalline source/drain regions 511b, a silicide film 513, an interlayer insulating film 514, and a metal wire 515.

Next, a method for fabricating the dual-gate-structure CMOS transistor semiconductor device of Example 2 will be described with reference to FIGS. 13 through 16. FIGS. 13 through 16 are cross-sectional views illustrating structures obtained in steps in the fabricating method.

Figure 13:
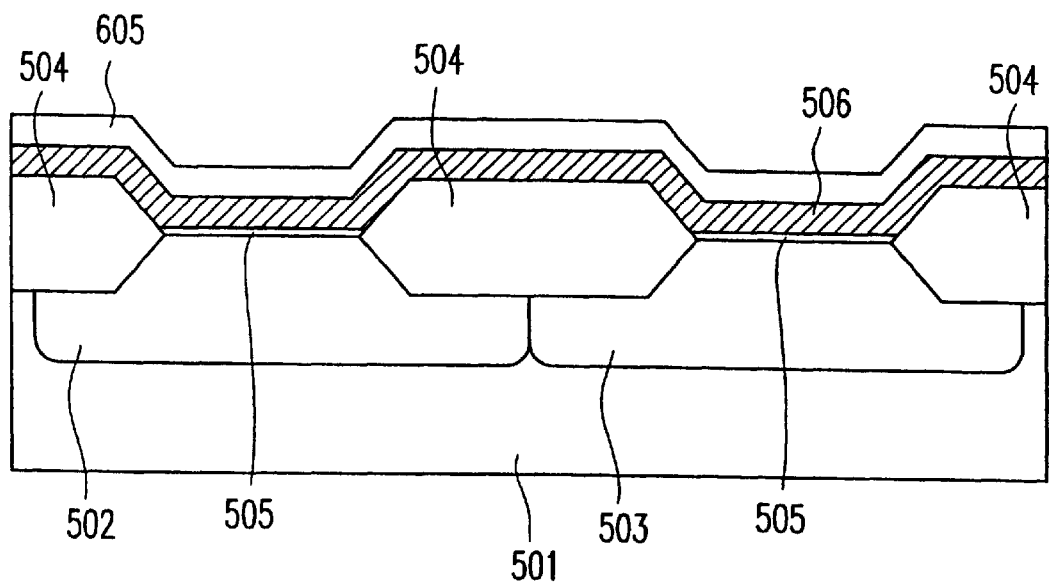
FIG. 13 is a cross-sectional view illustrating a fabricating step of the stacking-structure CMOS transistor semiconductor device shown in FIG. 12.

As shown in FIG. 13, a p⁻-well 502, an n⁻-well 503, and a field oxide film (element-isolating region) 504 are formed on a silicon substrate 501 in a known way in the art.

To control the threshold voltage and prevent the short channel effect, a region in which an NMOS transistor element is to be formed on the p⁻-well 502 is doped with boron and a region in which a PMOS transistor element is to be formed on the n⁻-well 503 is doped with phosphorous. Those elements are implanted as impurity ions. A gate insulating film 505 (e.g., an oxide film) having a thickness of about 5 nm is then formed on the wells 502 and 503, and a polycrystalline silicon film 506 is deposited to cover the field oxide film 504 and the gate insulating film 505. The thickness of the polycrystalline silicon film 506 is about 200 nm. A silicon oxide film 605 having a thickness of about 200 nm is deposited on the polycrystalline silicon film 506 with LPCVD. FIG. 13 shows a cross-sectional view of the structure which has been so far fabricated.

Figure 14:
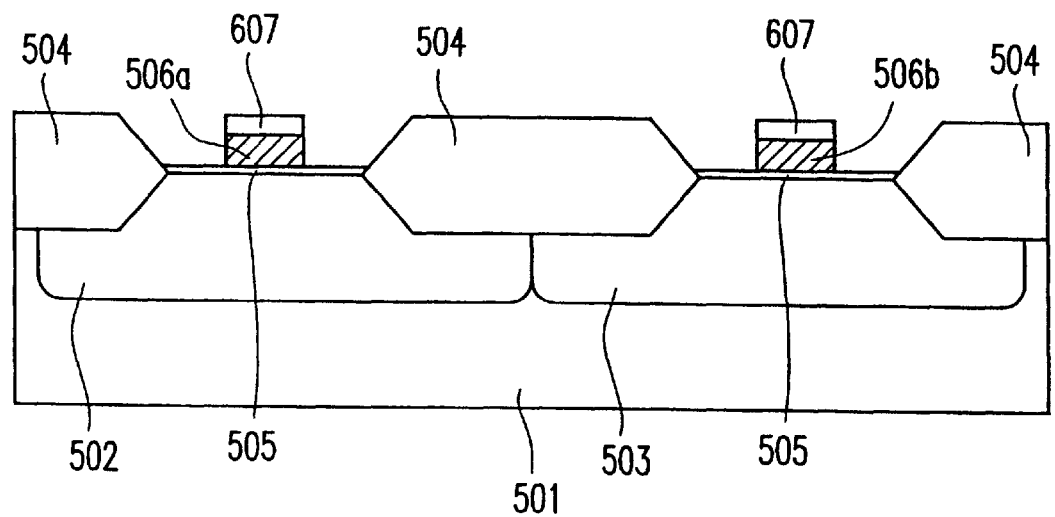
FIG. 14 is a cross-sectional view illustrating another fabricating step of the stacking-structure CMOS transistor semiconductor device shown in FIG. 12.

The polycrystalline silicon film 506 is then patterned to the desired shape with well-known photolithography and etching techniques, thereby obtaining the gate electrodes 506a and 506b. In this step, the silicon oxide film 605 on the polycrystalline silicon film 506 is also patterned, so that a mask oxide film 607 is formed on the gate electrodes 506a and 506b. FIG. 14 shows a cross-sectional view of the structure which has been so far fabricated.

Figure 15:
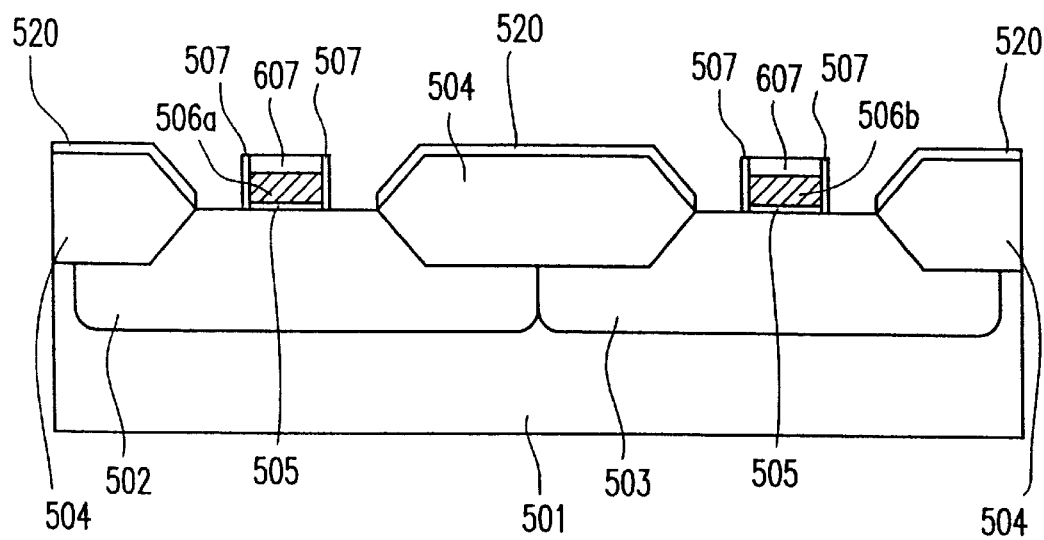
FIG. 15 is a cross-sectional view illustrating another fabricating step of the stacking-structure CMOS transistor semiconductor device shown in FIG. 12.

A silicon nitride film 520 having a thickness of about 50 nm is formed on the structure shown in FIG. 14 with LPCVD. The desired part of the resulting structure is then subjected to patterning in a photolithography step. A pair of sidewalls 507 are formed on the sides of the gate electrodes 506a and 506b with dry etching in an etchback step. In this step, the silicon nitride film 520 is left on the field oxide film (element-isolating film) 504. Thereafter, the oxide film 505 formed on the wells 502 and 503 (active region =source/drain regions) which are not covered with the gate electrodes 506a and 506b is completely removed with a solution of hydrofluoric acid or the like. FIG. 15 shows a cross-sectional view of the structure which has been so far fabricated.

Thereafter, an amorphous silicon film having a thickness of about 300 nm is formed on the structure shown in FIG. 15 and is subjected to annealing in an atmosphere of nitrogen gas at a temperature of about 650° C. The annealing causes the crystal growth (crystallization) in the amorphous silicon film, resulting in a polycrystalline silicon film. The polycrystalline silicon film may be directly formed by LPCVD or like. In Example 2, the polycrystalline silicon film is obtained by the crystal growth of the amorphous silicon film. The amorphous silicon film or the polycrystalline silicon film may be formed in a low pressure CVD (LPCVD) apparatus having a preliminary exhaust chamber, a nitrogen purging chamber in which a dew point is constantly −100° C., and a deposition furnace. This device allows deposition of amorphous silicon film or polycrystalline silicon film without growing a natural oxidization film at an interface between a surface of an active region of the semiconductor substrate 501 and the deposited amorphous silicon film or polycrystalline silicon film.

In this case, immediately before the deposition of the polycrystalline silicon film on the wafer, the wafer is washed with a solution of hydrofluoric acid so as to remove a natural oxidization film. The wafer is then transferred into the preliminary vacuum exhaust chamber in atmospheric air. The atmospheric air is then exhausted to vacuum and is replaced with nitrogen gas. The wafer is then transferred to the nitrogen purging chamber in which the dew point is constantly −100° C. In the nitrogen purging chamber, the nitrogen purge removes water molecules adsorbed on the wafer surface completely. The water molecules adsorbed on the wafer surface cannot be removed completely in vacuum. The experiments conducted by the inventors have demonstrated that the nitrogen purge can perform such complete removal. In a typical LPCVD apparatus, the wafer is transferred to the deposition furnace along with the water molecules adsorbed on the wafer surface. The deposition of the amorphous silicon film is typically conducted at a temperature of about 500° C. to about 550° C. On the other hand, the deposition of the polycrystalline silicon film is conducted at a temperature of about 550° C. to about 700° C. Oxygen of the adsorbed water molecules reacts with the silicon wafer in the high-temperature deposition furnace. For this reason, natural oxidization film is formed on the silicon wafer surface before the polycrystalline silicon film is deposited. The natural oxidization film is formed on the interface between a surface of an active region of a semiconductor substrate and the deposited polycrystalline silicon film. On the other hand, in the LPCVD used in Example 2, water molecules are removed completely from the wafer in the nitrogen purging chamber before the wafer is transferred to the deposition furnace. Therefore, a natural oxidization film is not formed on the interface, thereby making it possible to deposit amorphous silicon film or polycrystalline silicon film.

Subsequently, the wafer is subjected to oxidization annealing in an atmosphere of oxygen gas at a temperature of about 700° C. to about 900° C. This reduces the crystal defect density of the polycrystalline silicon film included in the gate electrodes 506a and 506b (specifically, the density is about $1 \times 10^{18}$ cm$^{-2}$ or less). Oxidized silicon film formed by the oxidization annealing is removed with wet etching. The polycrystalline silicon film is then etched back so as to form source/drain regions 511a and 511b on the sides of the sidewall 507. The source/drain regions 511a and 511b are made of the polycrystalline silicon film.

The region in which a PMOS transistor element is to be formed is then covered with photoresist film in a photolithography step. Thereafter, arsenic ions are implanted into the region in which an NMOS transistor element is to be formed. This ion implantation is carried out with an accelerating energy of about 2 keV to about 30 keV to otain an implantation amount of about $1\times10^{15}$ cm$^{-2}$ to about $5\times10^{15}$ cm$^{-2}$. The arsenic ions are impurity ions which serve as donors in the silicon semiconductor. Alternatively, phosphorous ions may be used as the above-described impurity ions for the NMOS transistor element. Phosphorous-ion implantation is carried out with an accelerating energy of about 3 keV to about 35 keV to obtain an implantation amount of about $1\times10^{15}$ cm$^{-2}$ to about $1\times10^{16}$ cm$^{-2}$.

Next, after removing the photoresist film, the region in which an NMOS transistor element is to be formed is covered with another photoresist film in a photolithography step. Boron ions are then implanted into the region in which a PMOS transistor element is to be formed. This ion implantation is carried out with an accelerating energy of about 10 keV to about 30 keV to obtain an implantation amount of about $1\times10^{15}$ cm$^{-2}$to about $1\times10^{16}$ cm$^{-2}$. The boron ions are impurity ions which serve as acceptors in the silicon semiconductor.

In the description of Example 2, the polycrystalline silicon film which has been doped with impurities is subjected to the oxidization annealing before being etched back to form the polycrystalline source/drain regions 511a and 511b. This reduces the crystal defect density of the polycrystalline silicon film. Alternatively, the ion implantation may be carried out after the etchback of the polycrystalline silicon film, followed by the oxidization annealing, thereby reducing crystal defects. In this case, activation of impurities and reduction of crystal defects are simultaneously carried out, resulting in an increase in the activation ratio.

Next, after removing the photoresist film, the above-described structure is subjected to RTA at a temperature of about 1000° C. to about 1100° C. for about 10 seconds. In the RTA, the impurities implanted in the polycrystalline silicon film which is included in the polycrystalline source/drain regions 511a and 511b are activated. The impurities are diffused into the semiconductor substrate from the polycrystalline silicon film (the polycrystalline source/drain regions 511a and 511b). The RTA may be replaced with annealing which is carried out at a temperature of about 850° C. to about 950° C. for about 10 minutes to about 30 minutes. For that reason, the shallow p-type diffusion layer 509 is formed in the region in which a PMOS transistor element is to be formed on the n$^-$-well 503. The shallow n-type diffusion layer 508 is formed in the region in which an NMOS transistor element is to be formed on the p-well 502.

Figure 16:
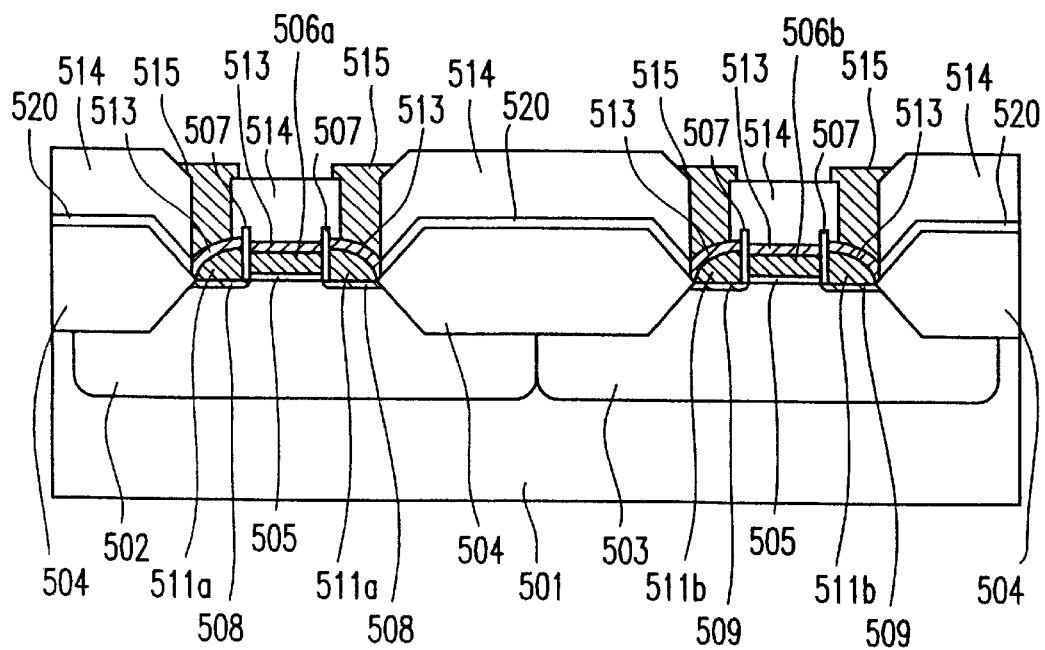
FIG. 16 is a cross-sectional view illustrating another fabricating step of the stacking-structure CMOS transistor semiconductor device shown in FIG. 12.

Thereafter, formation of a silicide film 513 by a salicidation step, deposition of an interlayer insulating film 514, formation of a metal wire 515 and the like are carried out in a well-known way. As a result, a dual-gate-structure CMOS transistor semiconductor device having the desired structure as shown in FIG. 16 is obtained.

As described above, according to this invention, a reduced crystal defect density (e.g., about $1\times10^{18}$ cm$^{-3}$ or less) of a polycrystalline semiconductor film (e.g., a polycrystalline silicon film) allows sufficient activation of the impurities therein. As a result, a semiconductor device (e.g., a transistor) having an excellent operating characteristic (e.g., sufficiently high transconductance).

Specifically, this invention can be applied to a surface-channel CMOS transistor having a dual-gate structure. Even when energy used in implanting ions such as phosphorous or arsenic as an n-type impurity is reduced so as to prevent the short channel effect, carriers are not depleted from a gate electrode, thereby obtaining sufficient driving current.

This invention can be also applied to a transistor having a shallow junction formed in source/drain regions using a stacking structure for preventing the short channel effect of a transistor. Even when polycrystalline semiconductor film (e.g., polycrystalline silicon film) is used as the stacked source/drain regions, the crystal defect density of the polycrystalline semiconductor film can be about $1\times10^{18}$ cm$^{-3}$ or less according to this invention. For this reason, the activation ratio of impurities in the polycrystalline semiconductor film is high, thereby obtaining sufficiently low resistivity. As a result, the resistance of the source/drain regions stacked above a gate electrode and a channel region can be sufficiently reduced.

Thus, according to this invention, a gate electrode and source/drain regions having a low resistance can be obtained.

The polycrystalline semiconductor film (e.g., polycrystalline silicon film) according to this invention can be applied to a gate electrode portion. Impurities are prevented from penetrating into the channel region during impurity implantation. Depletion of the gate electrode in the vicinity of a gate insulating film also can be prevented. For this reason, a stable gate electrode can be formed in a large range of impurity amount in the ion implantation for the gate electrode, so that control of variation in threshold voltage and driving current can be improved.

This invention can be applied to source/drain regions of a stacking-structure transistor. The source/drain regions can constantly have a shallow junction having a low resistance. When impurity ions are simultaneously implanted into the source/drain regions and the gate electrode so that the number of steps can be reduced, margin of the process conditions are enlarged, thereby obtaining a stable characteristic of a transistor.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising:
   an insulating-gate field effect transistor structure including a gate electrode,
   wherein the gate electrode includes a polycrystalline semiconductor film having a crystal defect density of about $1\times10^{18}$ cm$^{-3}$ or less; and
   wherein an average grain size of the polycrystalline semiconductor film is 50 nm or more in a thickness direction of the film.

2. A semiconductor device according to claim 1, wherein the polycrystalline semiconductor film is a polycrystalline silicon film.

3. A semiconductor device according to claim 1, wherein the gate electrode includes a multilayer structure of the polycrystalline semiconductor film and a metal film or metal silicide film.

4. A semiconductor device according to claim 3, wherein the polycrystalline semiconductor film is a polycrystalline silicon film.

5. A semiconductor device comprising:

an insulating-gate field effect transistor structure including source/drain regions stacked above a semiconductor substrate;

wherein the source/drain regions each include a polycrystalline semiconductor film having a crystal defect density of about $1 \times 10^{18}$ cm$^{-3}$ or less; and wherein an average grain size of the polycrystalline semiconductor film is 50 nm or more in a thickness direction.

6. A semiconductor device according to claim 5, wherein the polycrystalline semiconductor film is a polycrystalline silicon film.

7. A semiconductor device according to claim 6, wherein the source/drain regions have a multilayer structure of the polycrystalline silicon film and a metal film or metal silicide film.

8. A semiconductor device comprising:

an insulating-gate field effect transistor structure including a gate electrode, and wherein the gate electrode includes a polycrystalline semiconductor film having an average crystal grain diameter of about 50 nm or more in the thickness direction.

9. A semiconductor device comprising:

an insulating-gate field effect transistor structure having source/drain regions stacked above a semiconductor substrate;

wherein the source/drain regions have a polycrystalline semiconductor film having an average crystal grain diameter of about 50 nm or more in the thickness direction.

10. A semiconductor device according to claim 8, wherein the polycrystalline semiconductor film included in the gate electrode is a polycrystalline silicon film.

11. A semiconductor device according to claim 9, wherein the polycrystalline semiconductor film included in the source/drain regions is a polycrystalline silicon film.

12. The semiconductor device of claim 1, wherein the polycrystalline semiconductor film is oxidation thermally annealed.

13. The semiconductor device of claim 5, wherein the polycrystalline semiconductor film is oxidation thermally annealed.

14. The semiconductor device of claim 8, wherein the polycrystalline semiconductor film is oxidation thermally annealed.

15. The semiconductor device of claim 9, wherein the polycrystalline semiconductor film is oxidation thermally annealed.

16. A semiconductor device comprising:

an insulating-gate field effect transistor structure including a gate electrode, and wherein the gate electrode includes a polycrystalline semiconductor film having a crystal defect density of about $1 \times 10^{18}$ cm$^{-3}$ or less, and crystals therein arranged so as to have an average crystal grain diameter of 50 nm or more in the thickness direction.

17. A semiconductor device comprising:

an insulating-gate field effect transistor structure including source/drain regions stacked above a semiconductor substrate; and wherein the source/drain regions each include a polycrystalline semiconductor film having a crystal defect density of about $1 \times 10^{18}$ cm$^{-3}$ or less and crystals therein arranged so as to have an average crystal grain diameter of 50 nm or more in the thickness direction.

18. A semiconductor device comprising:

a gate insulating film; and a polycrystalline silicon film provided so as to cover the gate insulating film, wherein an average grain size of the polycrystalline silicon film in a thickness direction of the film is 50 nm or more.

19. The semiconductor device of claim 18, wherein the polycrystalline silicon film is oxidation thermally annealed.

* * * * *